(12) United States Patent
Snyman

(10) Patent No.: US 9,431,577 B2
(45) Date of Patent: Aug. 30, 2016

(54) WAVELENGTH SPECIFIC SILICON LIGHT EMITTING STRUCTURE

(75) Inventor: Lukas Willem Snyman, Faerie Glen (ZA)

(73) Assignee: Tshwane University of Technology, Pretoria (ZA)

( * ) Notice: Subject to any disclaimer, the term of this patent is extended or adjusted under 35 U.S.C. 154(b) by 838 days.

(21) Appl. No.: 13/378,201

(22) PCT Filed: Jun. 15, 2010

(86) PCT No.: PCT/ZA2010/000031
§ 371 (c)(1),
(2), (4) Date: Mar. 5, 2012

(87) PCT Pub. No.: WO2011/038422
PCT Pub. Date: Mar. 31, 2011

(65) Prior Publication Data
US 2012/0153864 A1 Jun. 21, 2012

(51) Int. Cl.
*H01L 33/34* (2010.01)
*H01L 33/00* (2010.01)

(52) U.S. Cl.
CPC ........... *H01L 33/34* (2013.01); *H01L 33/0041* (2013.01)

(58) Field of Classification Search
CPC ........... H01L 33/0008; H01L 33/0012; H01L 33/34; H01L 33/346
See application file for complete search history.

(56) References Cited

U.S. PATENT DOCUMENTS

| | | | | |
|---|---|---|---|---|
| 4,794,441 A | * | 12/1988 | Sugawara | H03K 17/567 257/124 |
| 5,920,078 A | * | 7/1999 | Frey | B82Y 10/00 257/13 |
| 5,994,720 A | * | 11/1999 | Snyman | H01L 33/0008 257/79 |
| 6,111,271 A | * | 8/2000 | Snyman | H01L 33/0008 257/80 |

(Continued)

FOREIGN PATENT DOCUMENTS

WO  WO 2009/047716 A1  4/2009

OTHER PUBLICATIONS

L. W. Snyman, Three Terminal n+ppn Silicon CMOS Light Emitting Devices (450nm-750nm) with Three Order Increase in Quantum Efficiency, IEEE ISIE 2005 (from Applicant's IDS).*

(Continued)

*Primary Examiner* — Matthew W Such
*Assistant Examiner* — Stephen C Smith
(74) *Attorney, Agent, or Firm* — Merchant & Gould P.C.

(57) ABSTRACT

This invention relates to relates to silicon light emitting devices (SiLEDs), and its application into current Complementary Metal Oxide Semiconductor (CMOS) technology, as well into future Silicon on Insulator (SOI) technology. According to the invention, a silicon based light emitting device is designed to operate by means of avalanche carrier multiplication and emitting at the below threshold wavelength detection range for Silicon of 850 nm and such that it is compatible with CMOS silicon nitride, silicon oxi-nitride and polymer waveguide technology. This favors diverse electro-optical system applications such as electro-optical couplers, fast data transfer on and from chip, various optical interconnect configurations as well as diverse on-chip sensor, fluidic and micro-optical-mechanical sensor applications. Under particular operating conditions emissions at specific wavelengths (for example the longer wavelengths) may be favored, while in other cases tuning of the emitted radiation may be obtained.

16 Claims, 18 Drawing Sheets

(56) References Cited

U.S. PATENT DOCUMENTS

| | | | | |
|---|---|---|---|---|
| 6,365,951 | B1* | 4/2002 | Worley | H01L 33/34 250/214 LA |
| 7,462,874 | B1* | 12/2008 | Hopper | H01L 33/08 257/88 |
| 2003/0042494 | A1* | 3/2003 | Worley | H01L 23/48 257/98 |
| 2004/0208415 | A1* | 10/2004 | Kim | H01L 27/156 385/14 |
| 2005/0017257 | A1* | 1/2005 | Green et al. | 257/98 |
| 2006/0242350 | A1* | 10/2006 | Worley, Sr. | H04B 10/801 710/305 |
| 2009/0121236 | A1* | 5/2009 | Worley | H01L 27/15 257/84 |
| 2011/0012502 | A1* | 1/2011 | Du Plessis | H01L 33/0008 313/358 |
| 2012/0153864 | A1* | 6/2012 | Snyman | H01L 33/34 315/291 |

OTHER PUBLICATIONS

Snyman, L. et al. "Three Terminal $n^+$ppn Silicon CMOS Light Emitting Devices (450nm-750nm) with Three Order Increase in Quantum Efficiency", IEEE ISIE, vol. 3, Jun. 20-23, 2005, pp. 1159-1166.

Snyman, L. et al. "Increasing the efficiency of $p^+np^+$ injection-avalanche Si CMOS LED's (450nm-750nm) by means of depletion layer profiling and reach-through techniques", Proc. of SPIE, vol. 6898, Feb. 7, 2008, pp. 68980E-1-68980E-12.

Snyman, L. et al. "A Dependency of Quantum Efficiency of Silicon CMOS $n^+pp^+$ LEDs on Current Density", IEEE Photonics Technology Letters, vol. 17, No. 10, Oct. 2005, pp. 2041-2043.

\* cited by examiner a b c

W = 0.2 a)

b)

a)

b)

1500

WAVELENGTH SPECIFIC SILICON LIGHT EMITTING STRUCTURE

This application is a National Stage Application of PCT/ZA2010/000031, filed 15 Jun., 2010, which claims benefit of Serial No. 2009/04162, filed 15 Jun. 2009 in South Africa, Serial No. 2009/04163, filed 15 Jun. 2009 in South Africa, Serial No. 2009/04508, filed 26 Jun. 2009 in South Africa, Serial No. 2009/04509, filed 26 Jun. 2009 in South Africa, Serial No. 2009/04787, filed 8 Jul. 2009 in South Africa, Serial No. 2009/08833, filed 11 Dec. 2009 in South Africa, Serial No. 2010/00200, filed 12 Jan. 2010 in South Africa, Serial No. 2010/02021, filed 23 Mar. 2010 in South Africa, Serial No. 2010/03603, filed 21 May 2010 in South Africa and Serial No. 2010/03605, filed 21 May 2010 in South Africa and which applications are incorporated herein by reference. To the extent appropriate, a claim of priority is made to each of the above disclosed applications.

This invention relates to a light emitting structure. More particularly, this invention relates to silicon light emitting devices (SiLEDs), and its application into current Complementary Metal Oxide Semiconductor (CMOS) technology, as well into future Silicon on Insulator (SOI) technology.

BACKGROUND TO THE INVENTION

It has been recognized for many years that light emitting structures are capable of providing a viable alternative for classic light sources. More particularly, LED devices have been fabricated which have reached high light output over an extended period of time.

LED devices typically include a layer of electroluminescent materials such as Aluminium gallium arsenide, Gallium arsenide phosphide, Aluminium gallium indium phosphide or the like which are generally described as direct band gap semiconductors. By employing quantum dot structures, power output of these devices could be enlarged.

While these devices rely on dedicated manufacturing technologies including various steps of epitaxial processing, other attempts have been made to integrate light emitting structures within commercially available technologies, which include CMOS fabrication processes as an example.

The vast majority of micro-electronic devices are formed in silicon. Over the last several decades, a substantial effort has been directed to refining the reliability and manufacturability of these devices. As a result, silicon-based microelectronic devices have become dependable and inexpensive commodity items. Particularly, Complementary Metal Oxide Semiconductor (CMOS) technology has become a multi-billion industry providing the basis manufacturing technology for nearly 90% of all electronic commodities to society. Furthermore, Silicon-on-Insulator (SOI) technology is regarded as a future basis technology for combining optoelectronics technology with mainstream electronics manufacturing technology.

To our knowledge, the current state of the art focuses on 1100 nm and above optical communication systems for application in CMOS and SOI, mainly as a result of compatibility with long haul optical fibre communication networks. This approach has serious limitation since it requires the incorporation of Ge in the systems in order to realize efficient detectors, and or 1110-V technology using hybrid approaches in both material and processing procedures. These technologies are extremely complex and also very expensive.

To take advantage of the existing silicon-based knowledge and infrastructure, there is a great interest in integrating active optical components into CMOS and SOI silicon technologies. Silicon, however, is an indirect band gap semiconductor material which, unlike a direct band gap semiconductor material it has low photon emission efficiency.

One source of visible light from silicon is a reverse biased p-n junction under avalanche breakdown conditions. Avalanche breakdown occurs when the p-n junction is reverse biased to the point of where the electric field across the junction accelerates electrons such that they have ionizing collisions with the lattice. The ionizing collisions generate additional electrons which, along with the original electrons, are accelerated into having additional ionizing collisions. As this process continues, the number of electrons increases dramatically, producing a current multiplication effect. A small percentage of these collisions results in photonic emissions through intra-band carrier relaxation effects, and inter-band carrier recombination effects.

Building on this principle, Snyman, et al. in an article "A Dependency of Quantum Efficiency of Silicon CMOS n pp LEDs on Current Density, IEEE Photonics Technology Letters, Vol. 17, No. 10, October 2005, pp 2041-2043" [12], have reported that the efficiency of light emission from silicon in such avalanching Silicon Light Emitting Device (Av Si LED) can be substantially increased by utilizing a reverse biased p-n junction with a wedge-shaped tip that confines the vertical and lateral electric field.

One of these attempts has been disclosed in U.S. Pat. No. 5,994,720. According to this disclosure an optoelectronic device is formed in a chip of an indirect bandgap semiconductor material such as silicon. The device comprises a visibly exposed highly doped n+ region embedded at the surface of an oppositely doped epitaxial layer, to form a first junction region closed to the surface of the epitaxial layer. When the junction region is reverse biased to beyond avalanche breakdown, the device acts as a light emitting device to the external environment. The device may further include a further junction region for generating or providing additional carriers in the first junction region, thereby to improve the performance of the device. This further junction can be multiplied to facilitate multi-input signal processing functions where the light emission from the first junction is a function of the electrical signals applied to the further junctions.

Although the optoelectronic device can be formed in a chip of an indirect bandgap semiconductor material, further improvements of the light output power are generally desirable in order to explore new applications of these devices, Also, it has recently been discovered that silicon nitride and silicon oxi-nitride materials as well as certain polymers offer very low loss optical waveguides at the longer wavelengths in the 650-850 nm regime.

Accordingly, what is therefore required is a light emitting structure which not only offers an easier integration into an existing commercially available manufacturing technology, but also one which provides an improved light output at the longer wavelengths, but below the Si detector threshold wavelength of 850 nm. On the other hand, generation at specific wavelengths and tuning of such wavelengths would also be most beneficial.

Objects of the Invention

It is an object of the present invention to provide a light emitting structure, preferably a light emitting structure fabricated from commercially available manufacturing technology, which overcomes, at least partly, the disadvantages associated with existing light emitting structures.

It is also an object of the present invention to provide a light emitting structure which is both novel and involves an inventive step.

SUMMARY OF THE INVENTION

According to a first aspect of the invention there is provided a silicon based light emitting device operating by means of avalanche carrier multiplication and emitting light preferably at the below threshold wavelength detection range for Silicon of 850 nm, the device comprising a first body having a first region of high doping interfacing with a second region of lower doping and then interfacing with a third region of higher doping, such that transfer of carriers occurs from the first to the third region.

The Silicon Light emitting device may comprise an additional third electrical metal terminal electrically contacting the second region such that the electric field profile in the lower doped second region is modified, so as extract or inject additional carriers into or from the second region, and so as to enhance the light emission from the device, the first body interfaces with a second body such that effective transfer of optical radiation occurs from the first to the second body.

The Silicon Light emitting device may comprise means to extract or inject additional carriers into or from the second region, and so as to enhance the light emission from the device so as to cause enhanced recombination of excited carriers with a high density of defect states as introduced into the second region or a region bounding the second region, the first body interfaces with a second body such that effective transfer of optical radiation occurs from the first to the second body.

The Silicon Light emitting device may comprise means to enhance the light emission from the device so as to cause excited carriers to interact with a secondary material bounding or interfacing with the second region, or impregnated into the second region such that secondary photonic emission processes occur as a result of the interaction of the energetic carriers with the secondary material, the first body interfaces with a second body such that effective transfer of optical radiation occurs from the first to the second body.

The Silicon Light emitting device may comprise means to extract or inject additional carriers into or from the second region, and so as to enhance the light emission from the device, the first region being embedded into the second region such that the electric field profile along the boundary of the first region being modified and enhanced multiplication of excited carriers occurs and such that enhanced light emission occurs from the device and the first body interfaces with a second body such that effective transfer of optical radiation occurs from the first to the second body.

The Silicon Light emitting device may comprise the first region being spaced from the second region such that a thin fourth region of very low doping level is introduced between the first and second region, so as to enhance the electric field profile between the first and second body and so as to enhance light emission from the device, the first body interfaces with a second body such that effective transfer of optical radiation occurs from the first to the second body.

The Silicon Light emitting device may comprise Complementary Metal Oxide Semiconductor (CMOS) technology.

The Silicon Light emitting device may comprise Silicon on Insulator (SOI) technology.

The Silicon Light emitting device may comprise a first terminal connected to the first region, a second terminal connected to the second region and a third terminal connected to the third region, wherein tuning of the emitted wavelength is obtained by means of changing a bias voltage applied to the terminals.

The Silicon Light emitting device may operate with a bias voltage between the first terminal and second terminal so as to provide emission in the range 450 nm-750 nm.

The Silicon Light emitting device may operate with a bias voltage between the first terminal and third terminal so as to provide emission between 650-850 nm.

The above embodiments of the invention, then form the primary basis for the design of the current described all SOI or CMOS based light emitting structure. Key features derived from these investigations are below 850 nm wavelength (Si detector threshold) Si LED emitters and developing highly efficient opto-coupler structures in order to couple effectively from Si LED structures to waveguides.

The above embodiments of the invention have the potential to open up a whole new field of so-called "all-silicon" electro-optical applications such as opto-coupling, electro-optical isolators, data transfer from chip to the environments by means of optical fibre technology, electro-optical sensors, fluidic and diverse Micro-Optical Mechanical (MOEMS) devices which offer a whole new range of sensing and monitoring on CMOS chips using optical means, making them "smarter" and highly integrated.

Si avalanche-based light emitting devices according to the invention that can be integrated into CMOS integrated circuitry offer the following advantages:

Good electro-optical coupling and communication possibilities: The leakage currents at room temperature for small 10×10 micron detector are of the order of pico Amp and the low frequency floor power detection levels are in the order of pW's. The current power emission levels as emitted from Si CMOS LEDs are of the order of 10-100 nW's which is nearly three to four orders higher than the detectivity limits of CMOS pn detectors. The multi-billion, economy of scale, CMOS technology and its small micro feature fabrication capabilities, therefore, offers diverse electro-optical applications utilizing this Si LED technology.

High potential bandwidth speed of operation greater than 1 Gb/sec: The small size In Av CMOS LED structures offers high modulation speeds because the main component of the device operate in reverse bias mode of operation, and the small dimensions of the device offers low intrinsic parasitic capacitances, enabling very high modulation speeds. The eventual speed of integrated Si LED optoelectronic components in CMOS integrated circuitry is determined by the surrounding driving and signal processing circuitry. Substantial progress has been made in this regard leading to state of the art GHz signal processing speeds.

Good electrical isolation: Because of low leakage currents at room temperature, silicon CMOS technology offers very high electrical isolation between circuitry components.

Interference free detection and data processing: Optical detection and processing techniques are known to provide superior immunity to interference and noise. There is a massive trend to utilize optical techniques in microelectronics and commodity environment.

System reliability: Si avalanche diodes operate at high reliability levels in silicon technology and have a proven track record in this regard through utilization in especially power and Zener regulators.

It should be noted however, that the Si LED structures according to the invention are not limited to a specific application and these example merely serve as an explanation for potential usage.

BRIEF DESCRIPTION OF THE DRAWINGS

The invention will now be described in greater detail by way of example with reference to the following drawings in which.

DETAILED DESCRIPTION OF THE INVENTION

Making now reference to the drawings, embodiments of the present invention are outlined in more detail.

Figure 1:
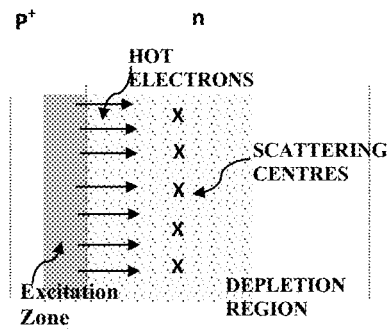
FIG. 1 schematically shows representations of the design concepts for Si Avalanche Light Emitting Diode (Si Av LED) technology with FIG. 1 (a) depicting the structure of the device, FIG. 1 (b) illustrating the electric field profile through the device and FIG. 1 (c) showing the energy gained of the diffusing carriers as a function of distance through the device.
Figure 1:
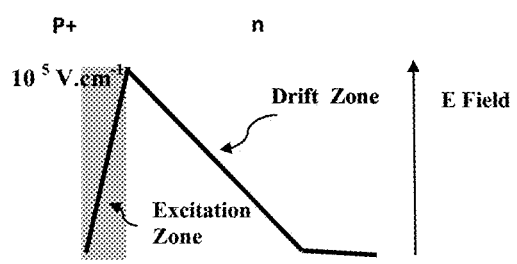
Figure 1:
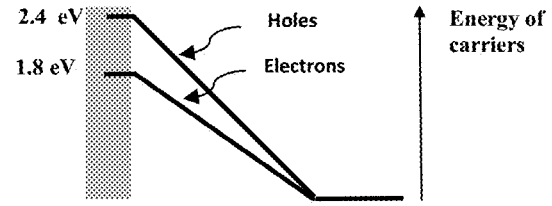

FIG. 1 illustrates a Si Avalanche Light Emitting Diode (Si Av LED) technology. FIG. 1 (a) shows structure of a p+n Si Av LED showing the dimension of the depletion region, diffusion of hot electrons, and its possible interaction with scattering centres. FIG. 1 (b) shows the electric field profile through the device. FIG. 1 (c) shows the energy gained of the diffusing carriers as a function of distance through the device.

FIG. 1 illustrates some of the conceptual design aspects of a $p^+$ n avalanche silicon LED technology, referring to specific device zones, electric field distribution, possible photonic transitions in the silicon energy band gap, and dynamic carrier densities during steady state operating conditions. Three clear activity regions of the device can be identified, that is a high field excitation zone generating hot carriers and a lower E-field drift zone.

The following provides more detail of the operation of the device may be described a follows. Upon biasing the device, a high linear increasing electric field is created at the one $p^+$ n junction with its maximum at the $p^+$ n interface. At some bias voltage, the E-field at the interface region attains high enough values such that charge multiplication (avalanche) processes occur in a narrow zone surrounding the interface. Energetic (excited) electrons are transferred towards the n-side of the junction and energetic (excited) holes are transferred towards the $p^+$ side of the junction.

Since the E-field decays linearly with distance away from the $p^+$ n interface, the transferred electrons soon reach regions where the E-field is not high enough in order to sustain ionization and carrier multiplication processes, but they will still be transferred away from the junction in the linearly decreasing E-field. This region is referred to the depletion zone or drift zone of the device.

Figure 2:
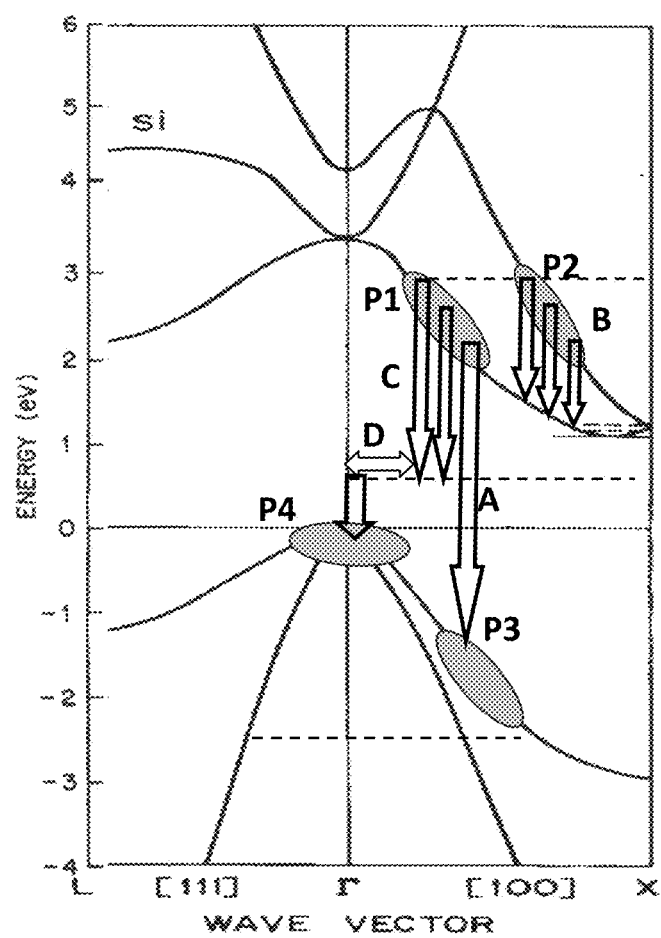
FIG. 2 schematically shows possible photonic energy transitions for the device in the Si band diagram.
Figure 3A:
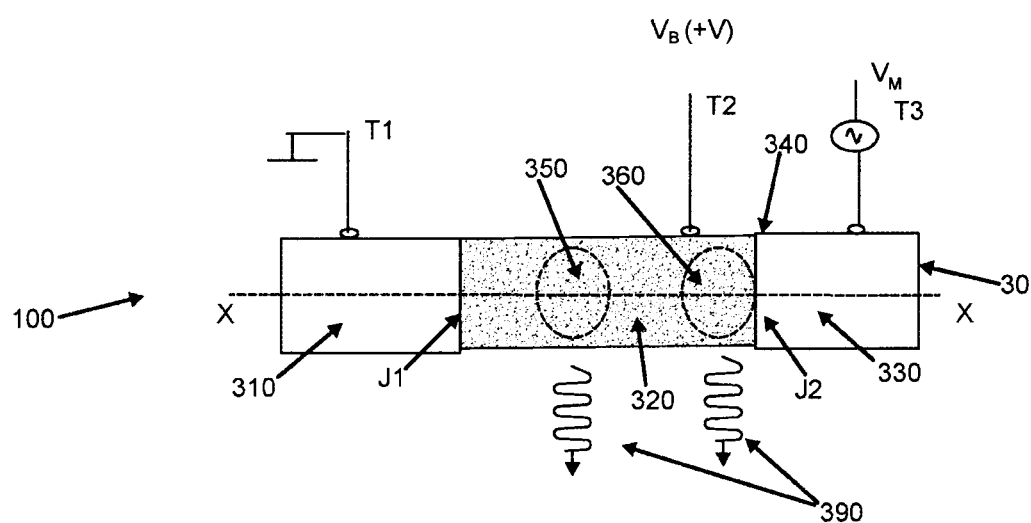
FIG. 3 (a) is a schematic presentation of the structure of the device.
FIGS. 3(b) to (e) are corresponding parameter profiles as function of distance through the device. The respective region interfaces/junctions are shown as dotted lines.
Figure 3B:
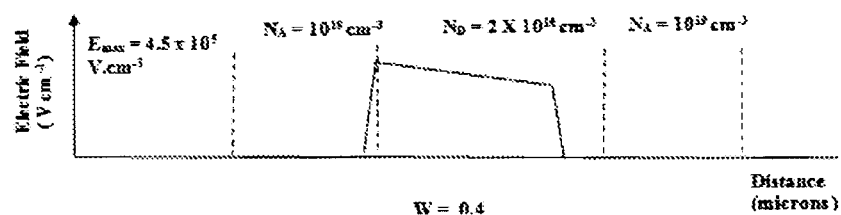
Figure 3C:
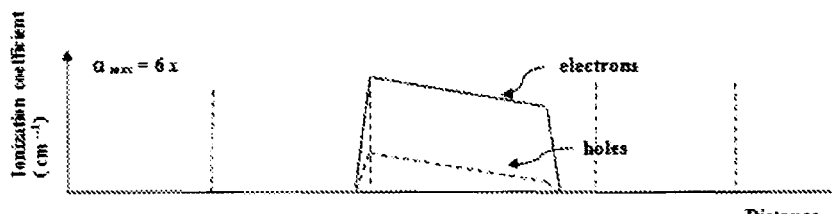
Figure 3D:
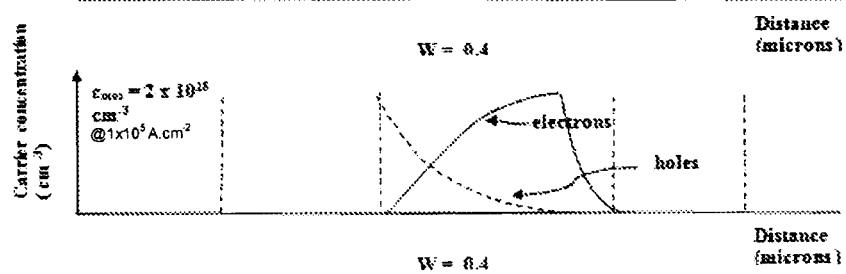
Figure 3E:
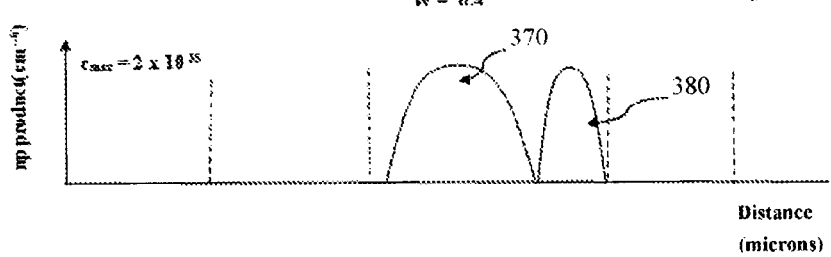

FIG. 2 is an energy band diagram of silicon showing the possible relaxation of carriers as well as recombination of electrons and holes in silicon after excitation to higher energies. FIG. 2 demonstrates some of the major photonic transition processes that may be stimulated in the above scenario. FIG. 2 is an energy band diagram of silicon showing the possible relaxation of carriers as well as recombination of electrons and holes in silicon after excitation to higher energies The origin of light emission processes in avalanching np silicon junction, suggested that the main light production processes are related to host silicon atom ionization processes in the high field avalanching conditions, followed by subsequent intra-band relaxation processes and phonon assisted indirect band-to-band transitions.

However, some high energy inter-band optical transitions may be stimulated in the silicon band structure by utilizing the recombination behavior between excited carriers and lower energy carriers, and by utilizing some novel device designs.

In the following, several embodiments of light emitting structures are described.

FIG. 3 (a) is a schematic presentation of the structure of the device in a side view. The basic active element of this system is a body 300. The body 300 is segmented in three regions, a first region 310, a second region 320 and a third region 330. The first region 310, the second region 320 and the third region 330 are arranged adjacent to each other and comprise different doping levels. The first region 310 is formed as a p+ structure, the second region 320 as an n structure and the third region 330 as either a n+ or p+ structure. Between the first region 310 and the second region 320, junction J1 is located, as indicated in FIG. 3 (a). Between the second region 320 and the third region 330, junction J2 is located. A top surface wall is schematically indicated by reference numeral 340. An electron-hole recombination zone 350 is formed within the second region 320.

FIG. 3 is a schematic illustration of the layout in side view and voltage biasing that can be implemented in n⁺pp⁺ device in order to implement a modified (flat) E-field profile in the excitation part of the device and in order to create a high np recombination product in the device.

FIG. 3 (c), FIG. 3 (d) and FIG. 3 (e) are corresponding parameter profiles as function of distance through the device. The respective region interfaces/junctions are shown as dotted lines.

The first region 310 is highly doped, appropriately contacted and to ground or some reference voltage. The second region 320 is of lower doping and of longer dimension, and interfaces with the third region 330 of higher doping, either of the same or opposite doping kind. A strategic metal feed and contact T2 is placed in the second region which directly contacts the latter part of the second region. Appropriate metal feeds T1 and T3 contact the first region 310 and third region 320 as well.

The first junction, J1, between the first region 310 and second region 320 is reverse biased so that a depletion region extends into the second region 320. This is achieved by placing an appropriate voltage on the metal feed T2 that contacts the second region 320. The depletion region extends far enough through the second region 320 that it touches the metal contact T2 region.

An electric field profile is set up though the second region 320 as is shown in FIG. 3 (b). FIGS. 3 (c) and (d) shows the ionization profiles for electron and holes through the device 100, and the resulting electron and hole density profiles through the device 100 with body 300 along the line XX' as indicated in FIG. 3 (a) when a p+nn+ configuration is used. FIG. 3 (e) shows the subsequent electron hole recombination and electron relaxation profiles 370 and 380, each generating a particular light generation zone 350 and 360 in the device, as schematically indicated by arrows 390. Because of the high densities of both energetic electrons and holes generated in the flat E-profile region, electron hole recombination of Type A (450-650 nm) as in FIG. 2 will dominate in zone 350. Because the mean electron diffusion length is much larger than the decay profile of the E-Field after contact terminal T2, electron relaxation processes of Type B as in FIG. 2 will dominate in zone 360 of the device. When a p+np+ configuration is used, injection of holes can occur from third region 330 into the second region 320 and results in recombination of the exciting energetic electrons with low energy injected holes in zone 380, primarily according to processes of Type C as in FIG. 2. Particularly, because of the high densities of secondary carriers injected into region 320, very high recombination np product can be achieved.

Particularly, relaxation of energetic electrons occur in a low defect environment can be realised with a p+np+ configuration. Correspondingly, electron relaxation type of light emission with a longer wavelength (750-1000 nm) according to transitions of Type B in FIG. 2 can be realised with a p+nn+ configuration.

Correspondingly, electron recombination of Type C as in FIG. 2 with a longer wavelength (650-850 nm) according to transitions of Type C as in FIG. 2 can be realised.

By varying the bias voltage on the contact T2 the region near the junction J1 can be placed in light emission mode through avalanche multiplication processes by varying the E-Field profile through the device. Hence the device is therefore named a Modified E-Field Silicon Light Emitting Device (MOD-E Si LED).

Figure 4A:
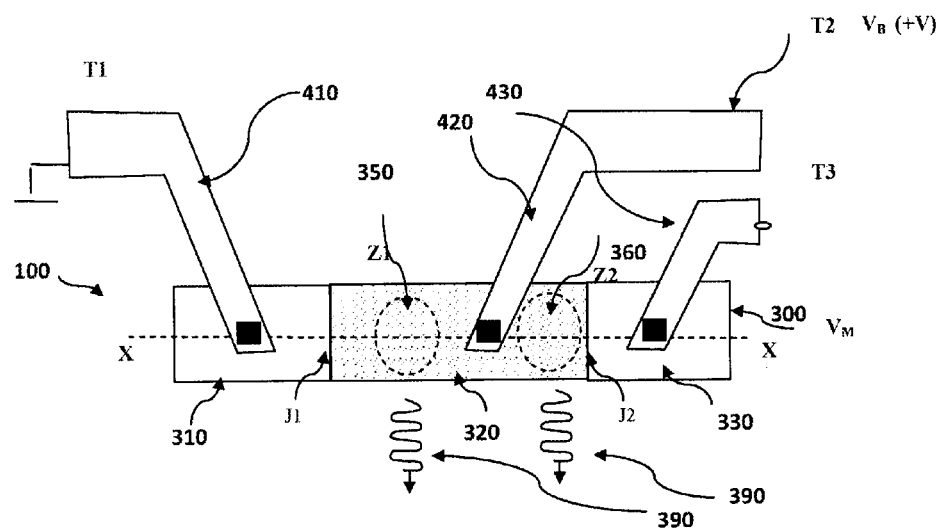
FIG. 4 is a schematic diagram showing (a) the structure of a E-MOD Si LED, the light emission zones, and (b), the electric field profiles through the device for various modes of operation of the device.
Figure 4B:
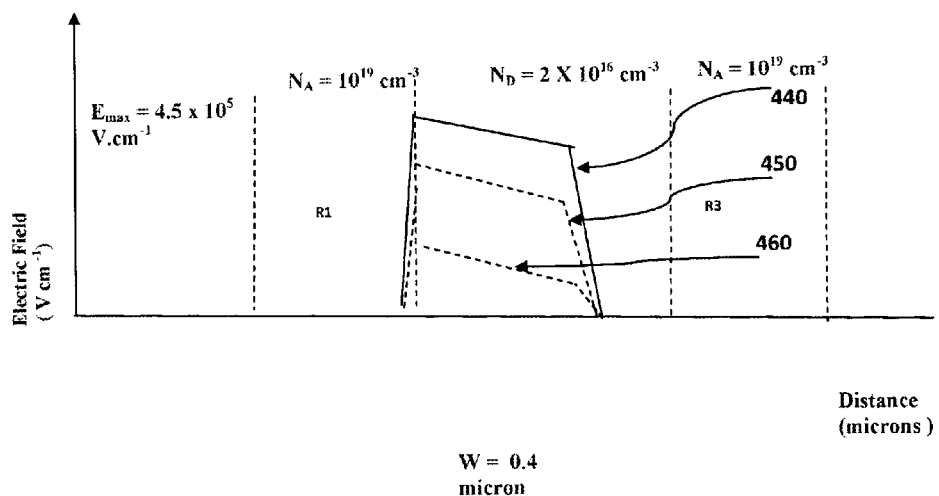

FIG. 4 is a schematic diagram showing (a) the structure of an E-MOD Si LED as device 100, the light emission zones 350 and 360, and (b), electric field profiles 440, 450 and 460 through the device for various modes of operation of the device 100. In FIG. 4 (a), the contacts T1, T2 and T3 are provide by respective metal feeds 410, 420 and 430.

A high bias voltage will ensure strong light emission, while lower bias voltage will cause lower light emission. A complete cut-off of the light emission can be achieved when the voltage is lower than threshold voltage as necessary for light emission. This is schematically shown in FIG. 4 (b) indicting active light emission mode by reference numeral 440, threshold for light emission by reference numeral 450 and cut-off of light emission by reference numeral 460.

Changing the bias voltage on the third terminal T3 will change the potential profile through the structure slightly according to partial current density profiles from the second region 320 into the third region 330, and can cause variations in the light emission levels, when partial bias voltage is supplied through this terminal. Hence analogue or digital intensity/amplitude modulation can be achieved.

In other cases, carriers may be injected from the third region 330 into the second region 320 such that variation in emitted light wavelength is achieved, hence achieving wavelength modulation of the emitted optical radiation.

Hence both amplitude and wavelength modulation can be achieved in the device by changing or modulating the E-field profile in region 2.

In another embodiment of the invention, the second region 320 may be sub-divided into thinner regions of lower or higher doping, so as to optimise the light emission processes or wavelength characteristics of the device 100.

The light emission is generated at a zone near either zone 350 or zone 360 (or both) and may be effectively couple light into an adjacently placed waveguide structure or into an optically transparent structure. This is in the following shown in more detail, making reference to FIG. 5.

For example, the contact feeds are provided on a metal contact layer 530.

Various types of waveguides may be utilised. Light may be coupled primarily into the CMOS over-layers through LOCOS and Si-Oxi-nitride or SiN based waveguide or optically transparent polymer structures. Alternatively the light may be coupled into Si-Oxi-nitride or SiN based waveguide trench based waveguide (OXI-TRENCH) structures, which can be primarily utilised in below 0.35 micron CMOS technologies. Particularly Oxi-nitride, silicon nitride or state of the art optically transparent polymer is suitable for the higher core material and offers very low power loss of lower than 0.1 dB in the wavelength range 700 nm to 1100 nm.

Both amplitude and wavelength modulation may be obtained with slight deviations in structure and operating conditions from the generic version of the device.

With slight modifications from the generic structures and concepts as described, the system may also be implemented into Silicon-On-Insulator technology as separate embodiments.

Figure 5:
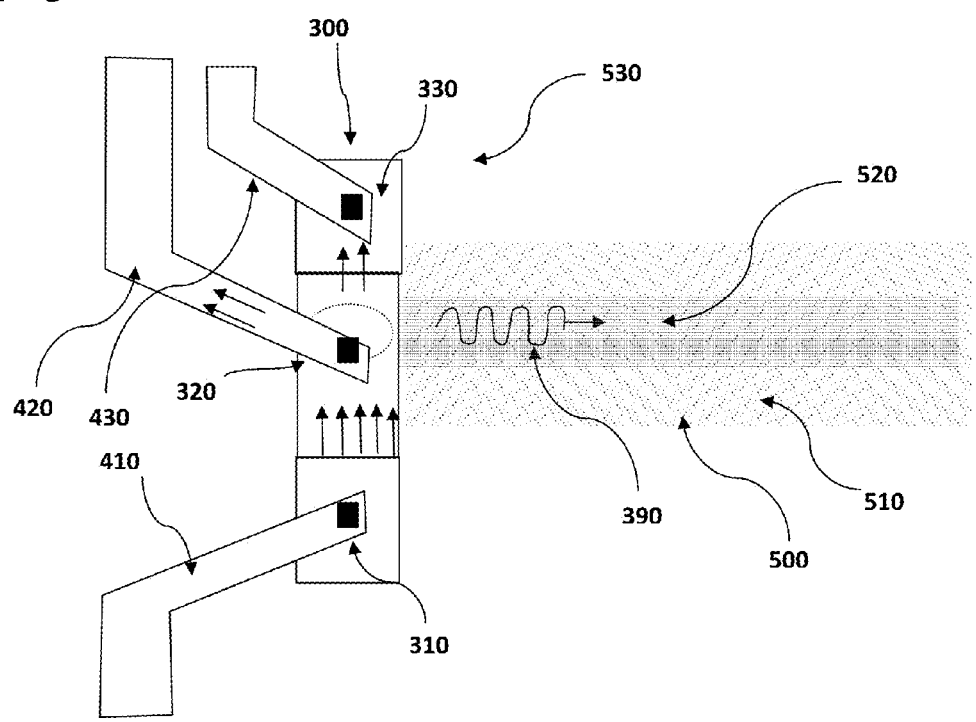
FIG. 5 is a schematic diagram showing the coupling of an E-MOD Si LED with an adjacent optically conductive body, in this embodiment designed as an optical waveguide with higher and lower refractive index regions.
Figure 6:
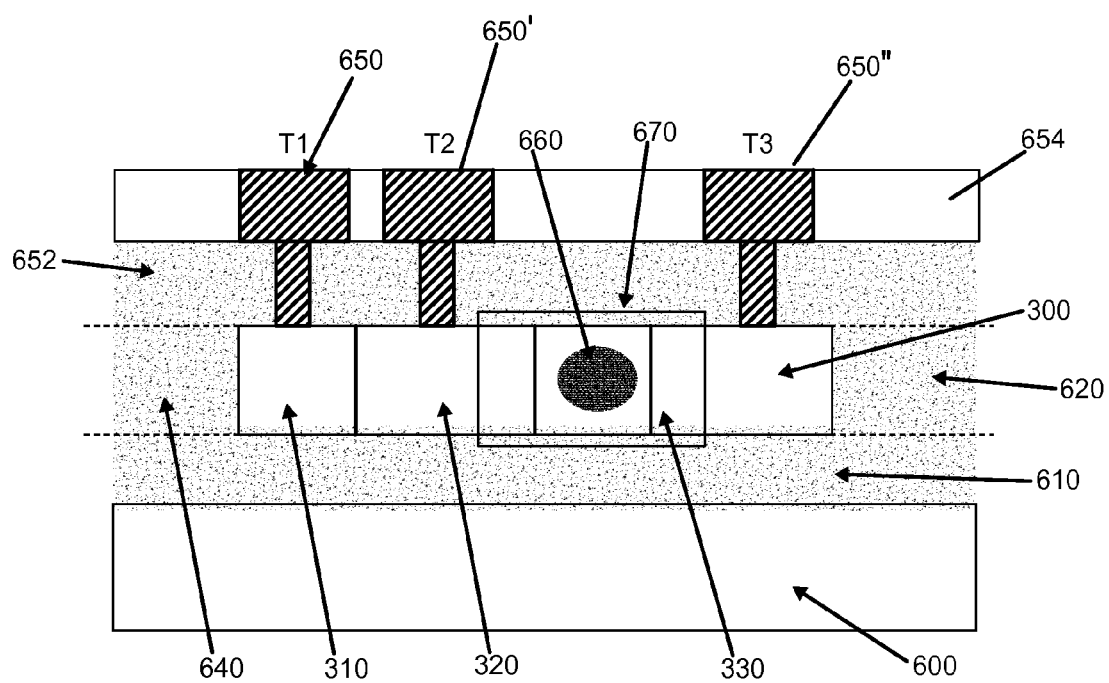
FIG. 6 shows a realization of the generic MOD E Si LED utilsing Silicon-on-Insulator technology.

FIG. 5 is a schematic diagram showing the coupling of an E-MOD Si LED device 100 with an adjacent optically conductive body 500, in this case designed as an optical waveguide with higher refractive index regions 520 and lower refractive index regions 510. It should be noted that all components can be fabricated using conventional CMOS processing technology FIG. 6 shows an embodiment of optical coupling into waveguides utilizing Silicon-On-Insulator technology in cross-sectional view. On a silicon substrate 600, a silicon oxide insulating layer 610 is formed. Above the silicon oxide insulating layer 610 a silicon layer 620 is present which can also be used for optional further active electronic components, as schematically indicated by reference numeral 640. On the silicon oxide insulating layer 610 the body 300 is formed. Here the respective regions 310, 320, and 330 of body 300 are defined adjacently to each other in order to create a functional Si LED structure. The p+nn+ active region is fabricated on the silicon layer 620 of the three layer silicon-on oxide on Si insulator substrate 600. The Electrical contact regions 650, 650' and 650" are realized with normal plasma deposition and etching techniques for all terminals T1, T2 and T3 contacting the respective regions 310, 320, and 330 of body 300.

A higher core refractive index 660 can be fabricated by modifying and trench fabrication technology. The waveguiding secondary optically conductive region 670 could be fabricated by either using plasma deposition, wet oxide or secondary polymer deposition techniques, such that a strip of low refractive index is generated that contacts the active light emitting regions of the body 300 region, and lying in the plane of the silicon on insulator layer 620. The higher refractive index core regions 660 can be fabricated adjacently to the body 300 structure, in the same plane as the silicon layer 620, by the same procedures, or using techniques and technologies as commonly utilized in the optical fibre telecommunications technology, and according to the structural layout concepts. The waveguides and electro-optical coupling structures as realized in the embodiments as described above may utilize either silicon oxide, silicon oxi-nitride, polymer or silicon nitride or combinations of these. The waveguides should be of suitable low loss selected, of glassy type.

Figure 7A:
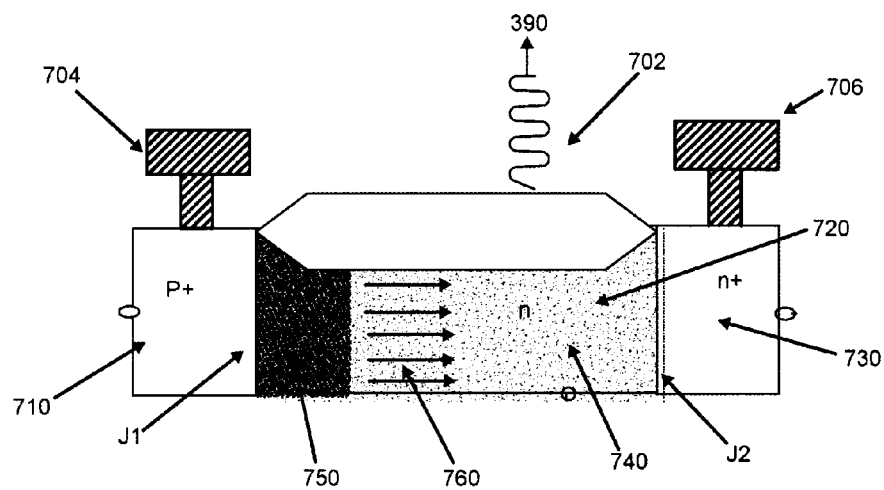
FIGS. 7a and 7b show realization of a version of the device favouring the relaxation of electrons in a low defect region, and utilising CMOS LOCOS oxidation technology.
Figure 7B:
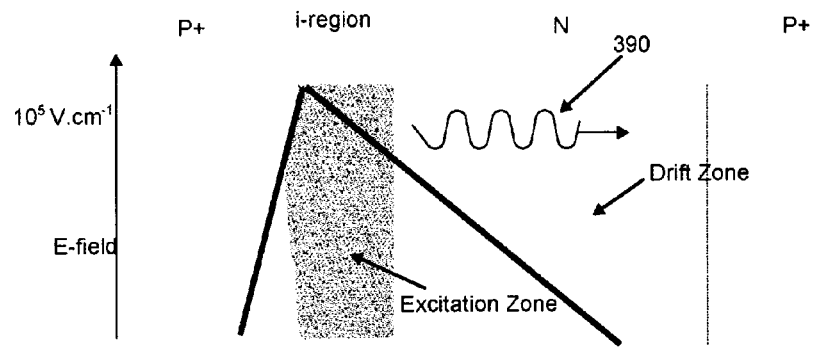

FIG. 7 shows the design concepts of a p+nn+ body 300 structure as can be realised with CMOS technology utilizing a standard LOCOS process. There are three regions 710, 720, and 730 arranged adjacent to each other. A silicon oxide layer 702 is placed above the region 720. Regions 710 and 730 are connected using electrical contacts 704 and 706, respectively. If the p+ and n+ regions 710 and 730 are placed sufficiently nearby (400 nm apart), the depletion region 740 can extend through the lowly doped region and may or may not touch the n+ region. This can reduce the overall operating voltage of the LED device. Junction J1 is reverse biased such that high multiplication or avalanche conditions occur in a narrow thin region surrounding the junction. This region is called the excitation zone 750. High densities of energetic electrons 760 subsequently drift in the high E field region and relax to lower energy values in the lowly doped regions where the E-Field is lower. By choosing the doping level of the n region 730 appropriately, the gradient (decay) of the electric field profile can be made very steep, such the electron mean path of the electrons exceed the total decay length totally or partially. This will particularly stimulate photonic transitions of type B as in FIG. 2. The emitted radiation 390 for this relatively simple structure will particularly favour emissions towards the 650 to 850 nm region.

Recombination of energetic electrons and energetic holes may occur according to transitions A in the excitation region in FIG. 2. In other embodiments of this structure, the doping level in the n-region 730 may be made low, such that a very flat E-profile is formed in the n-region. This will stimulate more electron hole multiplication processes and particularly stimulate transitions of Type A in FIG. 2 creating shorter wavelength and narrow band emissions (400-500 nm).

Figure 8A:
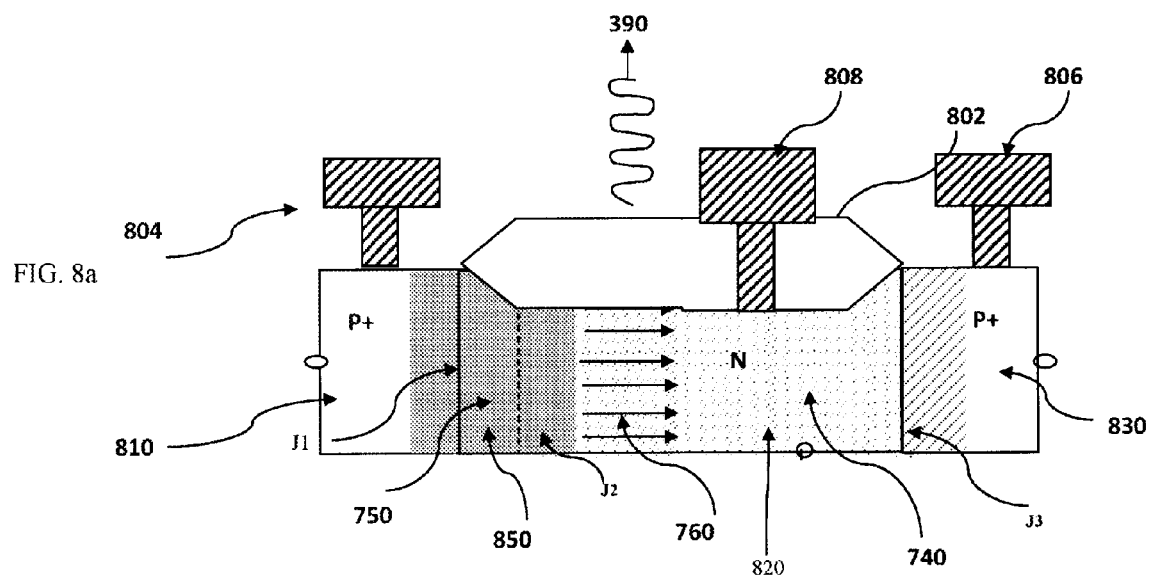
FIGS. 8a and 8b show realization of a version of the device favoring the relaxation of electrons in a low defect region, and utilsing CMOS LOCOS oxidation technology and a third contact terminal facilitated through the LOCOS oxide layer.
Figure 8B:
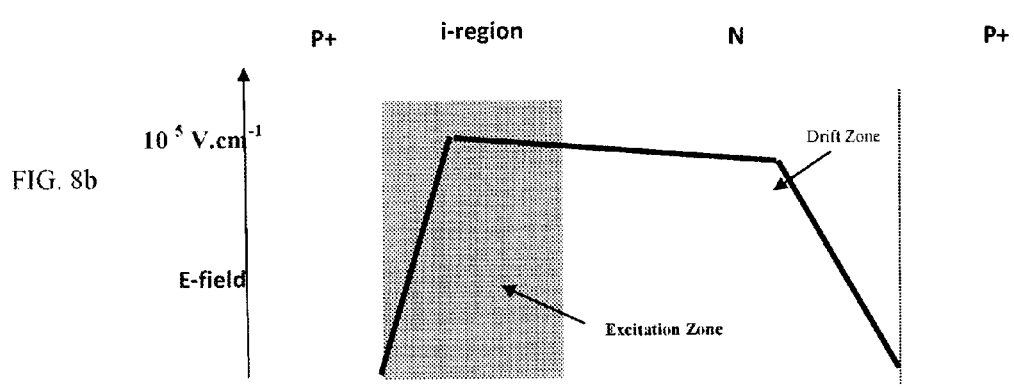

FIG. 8 shows an embodiment of the generic structure as in FIGS. 3 and 4 and according to the concepts of a modified and modulated E-field profile of the invention with a lower doped second region 820. There are three regions 810, 820, and 830 arranged adjacent to each other so as to form a p+np+ structure. A silicon oxide LOCOS structure 802 is placed above the second region 820. Regions 810, 820 and 830 are connected using electrical contacts 804, 808 and 806, respectively. The metal contact 808 (Aluminum on n-Silicon) probes through the LOCOS oxide 802 and provides a good forward biased contact to the lowly doped region 820. Bias voltage applied to this contact raises the E-field and flattens the E-field over a long lateral distance in the region 820. This particularly enhances the multiplication of electrons and holes, maximises the density of energetic carriers in this zone and particularly favours photonic transitions of A in FIG. 2. Correspondingly, a very long flat profile is generated, which will particularly enhance recombination between energetic electrons and holes; and which will favour the generation of radiation of Type A as in FIG. 1 at shorter (450-550 nm) wavelengths. An optional fourth region or i-layer 850 may be inserted at the junction J1 region in order to enhance the E-Field locally and to enhance carrier excitation and carrier multiplication further. The excitation zone 750 and depletion region 740 are also indicated in the drawing.

Figure 9A:
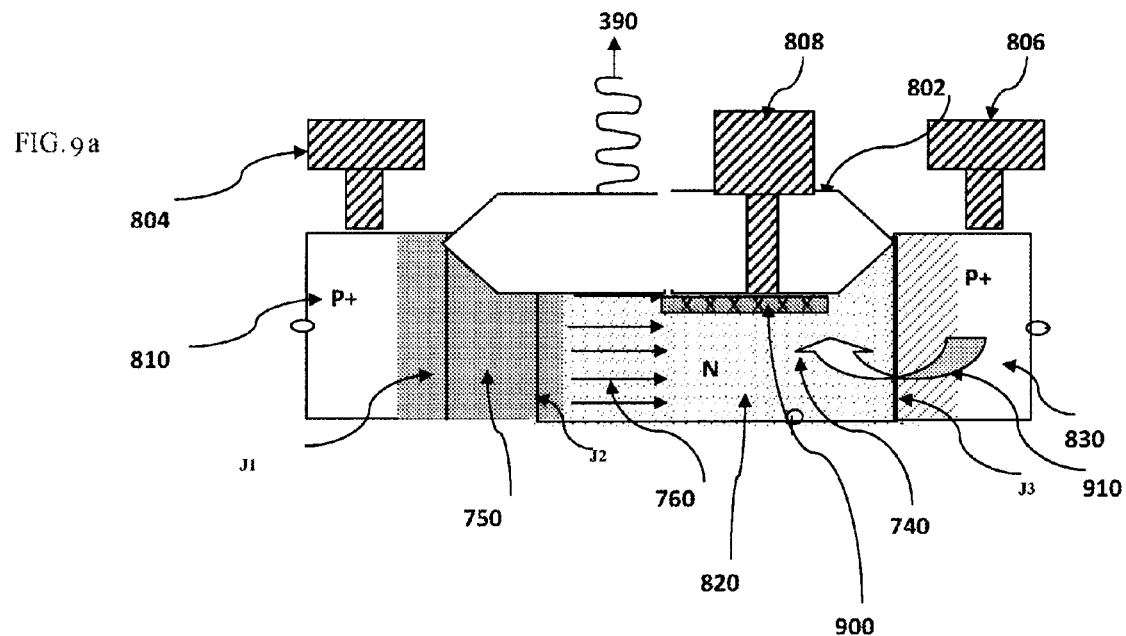
FIGS. 9a and 9b show realization of a version of the device utilizing CMOS LOCOS oxidation technology and a third contact terminal facilitated through the LOCOS oxide layer, favoring the relaxation of electrons in a low defect region with surface states present at the LOCOS—Silicon interface and injection of opposite charge carriers from the third region of the device.
Figure 9B:
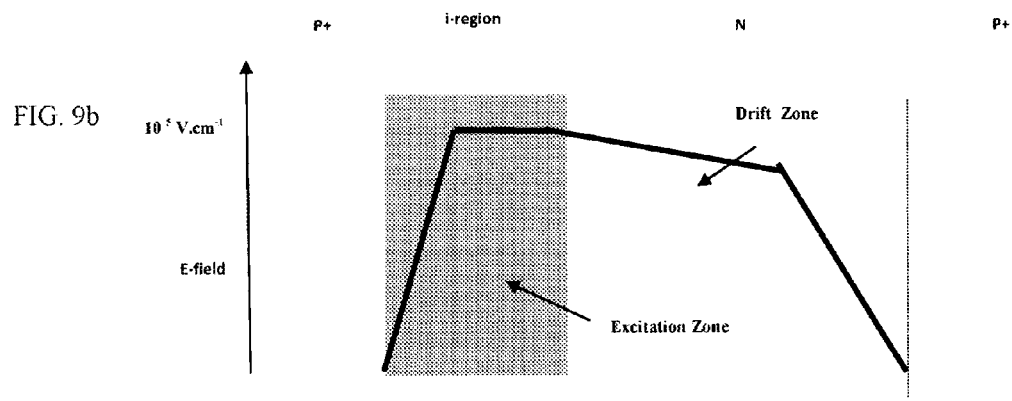

FIG. 9 shows an embodiment of the generic structure as in FIGS. 3 and 4 and according to the concepts of a Modified and modulated E-field profile, the same as in FIG. 8, but with defect states added 900 to the bottom surface of the LOCOS oxide 802. The metal contact 808 (Aluminum on n-Silicon) probes through the LOCOS oxide 802 and provides a good forward biased contact to the lowly doped region 820. Particularly, in this structure, a high density of surface states below the LOCOS oxide 802 are realised in a region corresponding the high electron relaxation zone. Also a large density of charges of opposite carriers 910 is injected from region 830 such that a high in reaction occurs between relaxing energetic electrons and low energy diffusing holes. Because of the high scattering that occurs with the oxide surface and surface states, a high "momentum spread" will particularly be experienced by the high energetic electrons. Since low energy holes are gaining energy in a sharp increasing electric field, a high momentum spread will also be experienced for holes. Such a condition will particularly favour transitions of Type C as in FIG. 2, yielding a wide broadband of emissions from 1.5 to 1.8 eV (650 nm to 750 nm). Additionally, a small section of gate poly silicon can also be placed on top of the LOCOS oxide in order to attract the injected minority carriers and in order to enhance momentum spread and carrier densities further. All these effects will enhance the intensity of optical emission and efficiency of the device. An optional fourth region or i-layer (very lowly doped layer) may be inserted at the junction J1 region in order to enhance the E-Field locally and to enhance carrier excitation and carrier multiplication further, similar to layer 850 in FIG. 8. The surface state density region 900 may be replaced by a layer of secondary light emission material which emits light as a result of excitation by the energetic carriers.

Figure 9C:
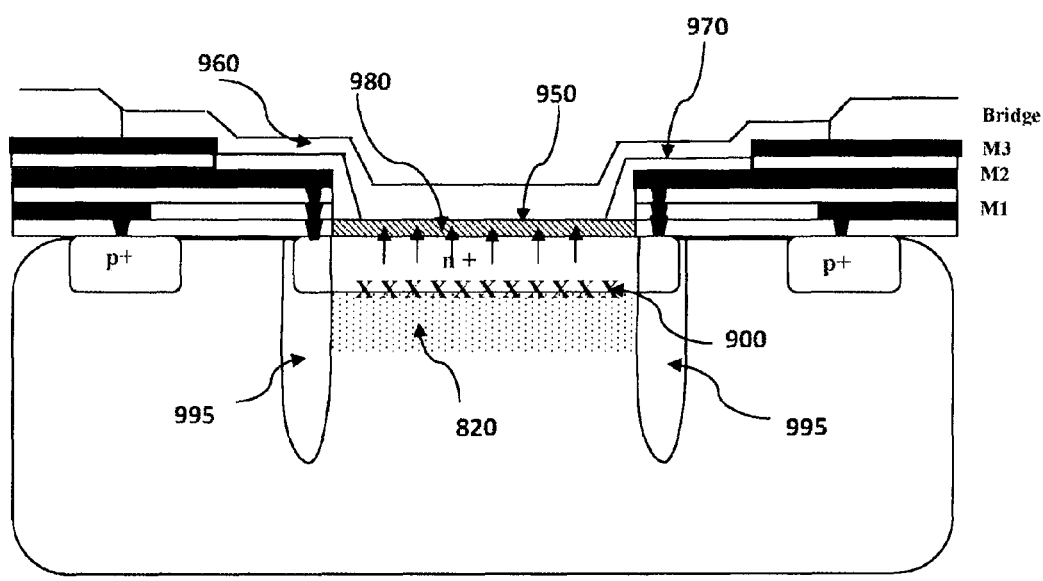
FIG. 9c is similar to the embodiment of FIGS. 9a and 9b and entails designing the hot electron acceleration structure in a CMOS die by means of normal design and processing procedures.

The embodiment of FIG. 9c is based on FIG. 9. The embodiment of the proposed technology entails designing the hot electron acceleration structure in a CMOS die by means of normal design and processing procedures. A target material 950 is then deposited on the die by means of a post processing procedure. It is proposed to RF etch a cavity through the top passivation layer 970 until the silicon interface 980 is reached. The target material is then deposited into the cavity by means of an appropriate low temperature process. The ITO layer 960 is finally deposited such that contact is facilitated with one of the CMOS metal layers to establish a light emission structure. Diverse other embodiments are also possible, for example utilizing an n+ buried layer and n-well layer. This light emission structure is separated by a trench 995 from the other light emission structures.

Figure 10A:
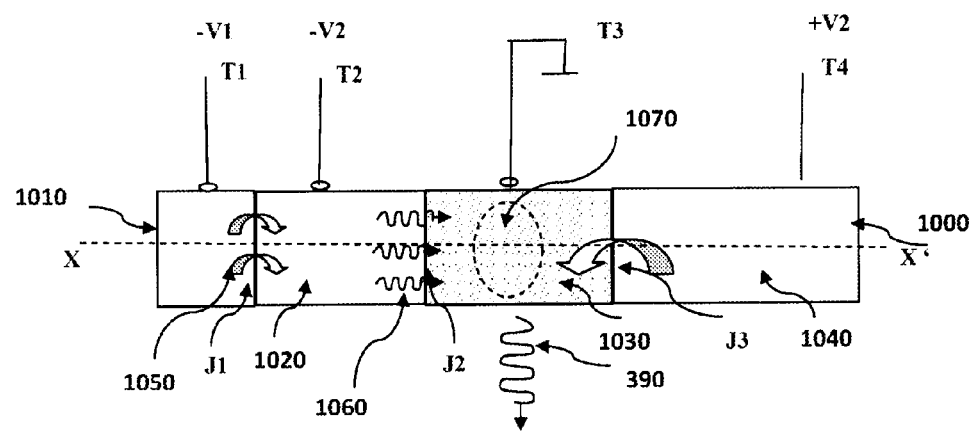
FIGS. 10a and 10b show an embodiment utilizing either above 0.35 or below 0.35 or SOI technology to generate an advanced MOD E Si LED device that utilises high density recombination of electrons with low energy holes in a high scattering environment.
Figure 10B:
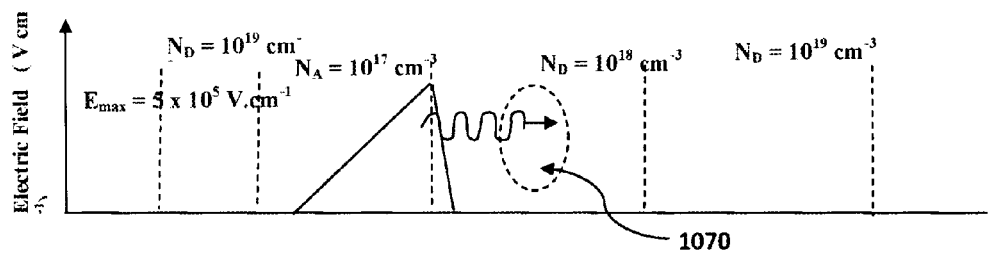

FIG. 10 is a further embodiment of the invention. The device comprises a first body 1000 (FIG. 10(a)) of the indirect bandgap semiconductor material, in this case single crystal or monolithic Si. The first body 1000 may have any suitable shape in transverse cross-section, such as triangular, or rectangular and embedded into each other, or positioned adjacently with each other. In the embodiment shown in FIG. 10(a), it is rectangular and separately placed adjacently to each other. More particularly, the first body has a thickness dimension d and in relevant parts thereof has a width dimension w. A first region 1010 of first doping kind is defined with high doping level, in this case n+. A region adjacent to the first region is defined as second region 1020 of opposite doping kind, in this case p, and of lower doping level. Adjacent to the second region 1020 is a third region 1030 of opposite doping kind as the first kind but of higher doping level, in this case n. Adjacent to region 1030 is a fourth region 1040 of again opposite doping kind than region 1030, and of higher doping level. Appropriate electrical terminals T1 to T4 are fabricated to each region 1010 to 1040 with metal layers and through oxide contact holes according to the normal methods of CMOS technology fabrication procedures as are illustrated in FIG. 10(a). The first region 1010 periphery with the second region 1020 provides a junction J1 which is forward biased such that electrons are injected into region 1020, as indicated by reference numeral 1050. The junction J2 is reverse biased into the avalanche mode. Because of the specific doping level employed in the second region 1020 and third region 1030, the electric field profile in the second region 1020 increases sharply towards region 1030 and peaks at J2, when bias voltage is applied. At this value, the ionization level reaches high enough value such that sufficient secondary electron hole pairs 1060 are generated are bigger than 1 per small thickness increment in region 1020. At this electric field value, the electrons are preferentially ionized due to the difference almost a factor 10 higher ionization potential than holes at this electric field strength of $2 \times 10^5$ V·cm$^{-1}$ as is illustrated in FIG. 10(b). The voltage bias on terminals T3 and T4 is again such that holes are injected from region 4 into region 3. Hence high densities of energetic electrons and low energy holes are injected from opposite sides that a high recombination of these carriers can occur in region 1070. FIG. 10(b) illustrates the electric field profile which is set up through the cross-section plane XX' as in FIG. 10(a), the dotted lines indicating the borders of the various regions. The excitation field maximum strength can be controlled by means of biasing at a value of $2 \times 10^{+5}$ V·cm$^{-1}$.

It is seen that this type of structure and method, creates a projected np product profile, P1, between energetic electrons and low energy (cool) holes of about $10^{35}$ with Type A recombination processes to be dominant in the light generation process.

The structure and method henceforth have the following advantages: The design hence enables achievable current density of about $10^6$ A·cm$^{-2}$ through the junction with no serious damage, degradation or hysteris effects in the IV curves of the junctions. The primary recombination products of up to $10^{35}$ can hence be achieved. This can significantly enhance the light output from the device.

Since the recombination processes occur under almost zero E-field conditions in region 3, in a region outside of the depletion region and it is projected that high scattering processes will occur in a high impurity and defect environment of region 1030. This may enhance momentum shifts in the carriers which may favour transitions of Type B and Type C.

The terminals T1 and T4 can both effectively be used to significantly alter the injection of both electrons and holes into the region 1010 at the J1 interface and substantially vary the light output from the device.

A further most important aspect of this structure is that a low electric field region may be applied in region 1030. This will enable continuous maintaining of scattering processes of holes at low E-field conditions and ensure a consistent change of the momentum states for the diffusing holes in region 1010. Furthermore, by varying the low electric field magnitude in this region (by means of an additional terminal T5 if necessary), the 'spread' of momentum can be changed. Hence the device may be 'tuned' in order to optimise the recombination of Type C as in FIG. 3, with hot electrons recombining low energy (cool) electrons. Furthermore the concept can be used to "tune" the energy of the holes, may allow for shifting of the predominant transitions in allow for "shifting" or tuning of the emitted radiation with bias.

In other embodiments a shift or tuning of the emitted wavelength may be obtained by means of changing the bias in p+np+ structures as in FIG. 3. When the device operates with primary bias between terminal T1 and terminal T2 emission in the range 450 nm-750 nm may be dominant, while operating the device with bias between terminal T1 and T3, longer wavelength emission between 650-850 nm will be favoured. Further refinement for narrower bandwidth emissions may be made according to the concepts as outlined in this invention.

Figure 11A:
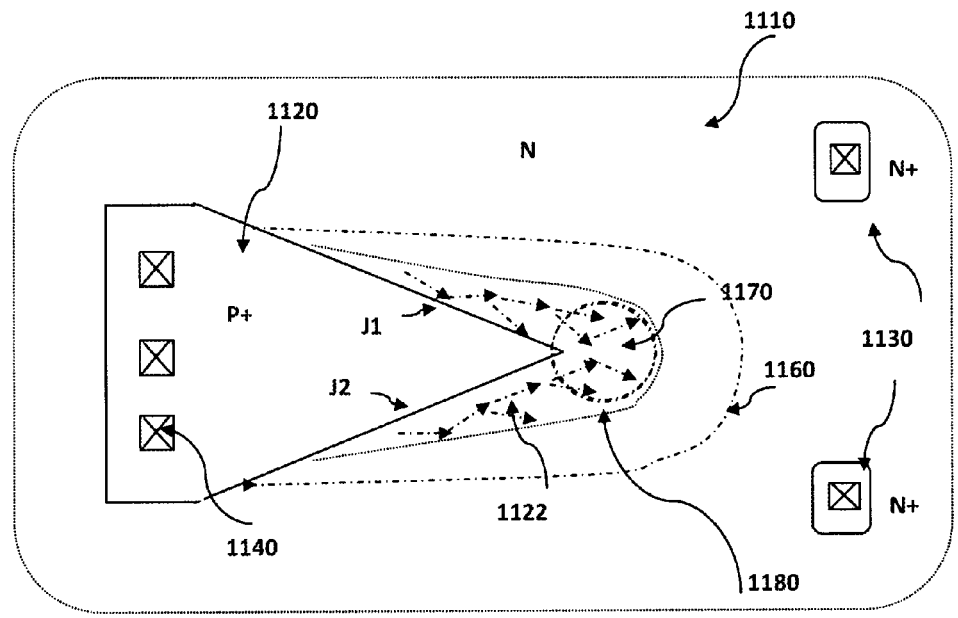
FIGS. 11a and 11b show realization of a version of the device utilsing embedding of region one and region 3 unto region 2, and favoring enhanced lateral multiplication of excited carriers as well as relaxation of electrons in a low defect region, and maximizing vertical emission out of the chip.
Figure 11B:
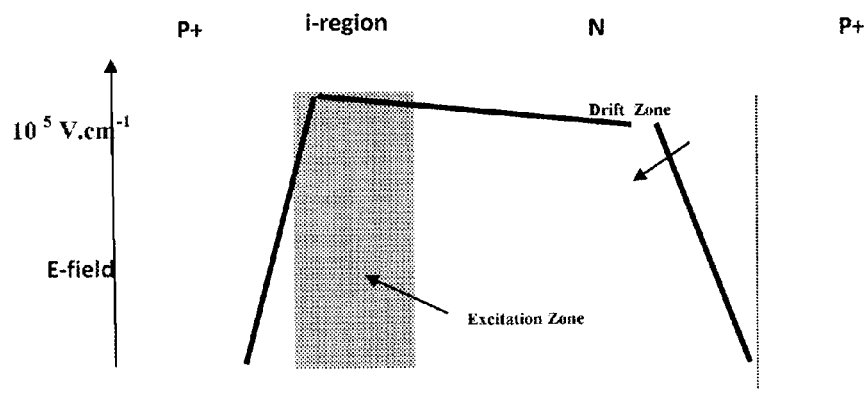

Further embodiments of enhanced light emission Si LEDs towards the longer wavelengths may be realised as in embodiments as in FIG. 11. Here the highly doped semiconductor region 1120 is realised with an elongated triangle and sharp point protrusion 1122. This structure is placed in a semiconductor region 1110 of lower doping which is sufficiently large to accommodate the maximum extended depletion region extending from the region 1120 upon reverse bias along the junction periphery (junction 1 and 2 interfaces), adjacent to the elongated triangle body side. Third low resistance electrical/ohmic contact regions 1030 are placed in the first, opposite and directly parallel to the maximum protrusion body length. The device is appropriately voltage biased such as to create an elongated depletion region along the periphery 1140 of the second body junction towards the electrical contact body regions. Charge carriers as excited in the maximum electric field region near to the junction (p+n junction in FIG. 11) interface, now will accelerate and transverse not perpendicular to the junction interface, but will rather laterally traverse laterally along the junction 1 and 2 interfaces as indicated by the arrows in FIG. 11. Since the depletion region (up to the edge 1160) is much more extended as compared to a normally oriented depletion region, the accelerated carriers will now traverse a much longer path before exiting the junction at the end of the depletion region. During their traverse path, they will undergo multiple mean free acceleration paths, each ending in a collision and ionization process of host lattice crystal atoms, defects, impurities, and or other carriers. During these interaction processes light photons are emitted, leading to a particular increase in the total light emission level from the device. It follows that the longer lateral trajectory paths, results in enhanced scattering and multiple mean free paths, each scattering event leading to the generation of further secondary carriers. This leads to an enhanced avalanche in multiplication of secondary carriers; an exponential increase in further accelerated carriers and an exponential increase in total light emission from the junction. The multiplication region is indicated by reference numeral 1180, leading to a dominant light emission region 1170. The excited carriers create secondary carriers that again cause new excitations and new light emission processes within the silicon itself. By choosing the primary semiconductor body material and conductivity types of the respective bodies, and using the fact that at the multiplication and avalanching of electrons are roughly twice for that of holes in silicon, the concentration and the type of energetic carriers can be engineered. p+n n+ type arrangement are there particularly suitable for yielding high intensity CMOS based LEDs. Consequently, appropriate secondary bodies can also be placed within reach of the excited carriers so as to create light emission from either the primary or secondary excited carriers. These Si LEDs were appropriately designated as "secondary excitation Si LEDs". The structure of the device is relatively simple and can be fabricated with ease utilizing CMOS technology.

The above descriptions of Si LED realizations are preferred embodiments. Variations of these embodiments may be applied to be compatible with both CMOS and SOI technology. The LOCOS oxide may be utilized to enhance surface state recombination effects and to displace the optical emission zones to match the core of the adjacent waveguide structures better or it may be omitted.

An additional spacer layer of very low doping level may also be inserted at the J1 region between first region and second region in order to obtain a short distance very flat E profile. This may in effect change all the embodiments from a three region devices to four region devices in the body.

In other embodiments of the invention the placement of the bias and signal voltages on the terminals as described in the generic version of the device as in FIGS. 3 to 4 may be interchanged, so as to achieve greater efficiency in modulation and signal detection.

In further embodiments the doping types of the respective regions may be changed to the opposite type in order to obtain spastics effects and specific efficiencies.

Figure 12:
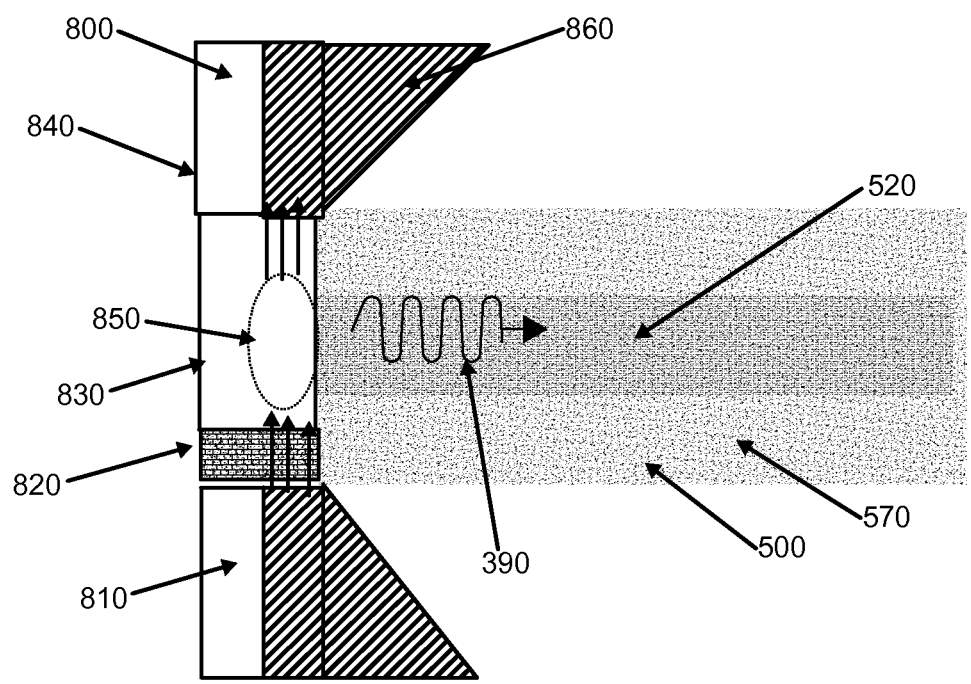
FIG. 12 shows a schematic representation of an embodiment of the generic E-MOD Si LED in order to enhance silicon and optical waveguide interface charge carrier interaction as well as enhancing optical coupling from the Si LED into a lateral positioned waveguide.

FIG. 12 shows a further embodiment of the invention in order to enhance the optical coupling from the body 300 structure into the optical conducting body 500. FIG. 12 shows a schematic representation of an embodiment of the generic E-MOD Si LED in order to enhance silicon and optical waveguide interface charge carrier interaction as well as enhancing optical coupling from the Si LED into a lateral positioned waveguide. Here the generic body 800 structure comprising three or four regions 810 to 840 are used, but the metal contacts and feeds are such placed on metal layer 860 that a higher current density is favoured at the surface of second region 820 and third region 830, hence maximizing optical yield at the region 820 and region 830 surface with the optical fibre core, hence enhancing coupling of the optical radiation 390 into the higher index core 520 of the waveguide 500.

Figure 13:
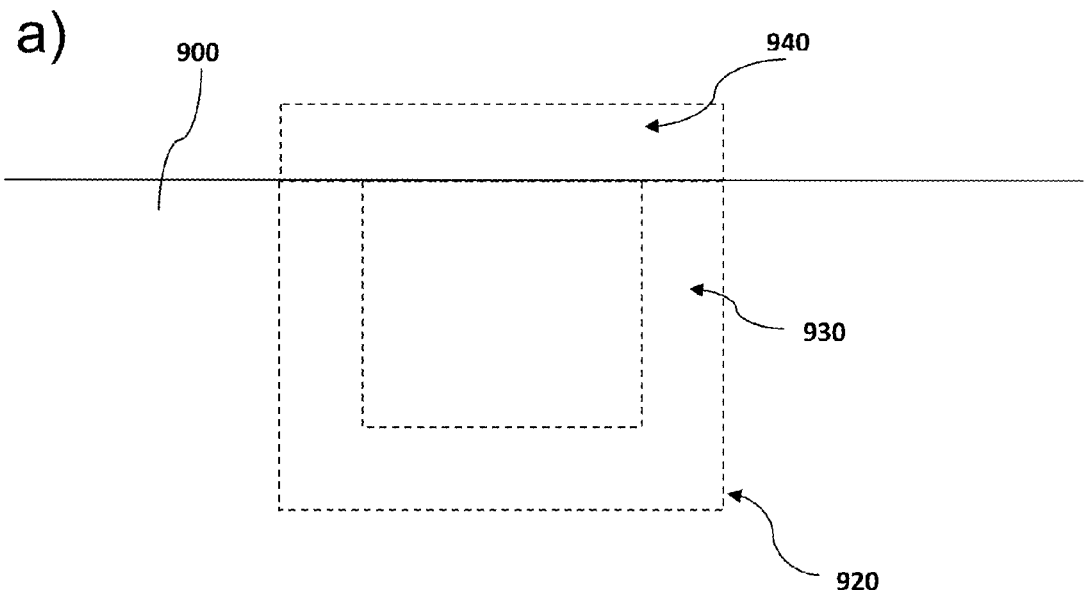
FIGS. 13a and 13b show a schematic representation of an embodiment of a silicon waveguide in CMOS technology utilising existing isolation trench technology. (a) represents a technology of filling up the trench with higher refractive index material after deposition of a suitable liner of lower refractive index material. (b) represents a similar filling process but with an overlap of deposited or growth material over the trench such that an "inverted ridge" waveguide is formed.
Figure 13:
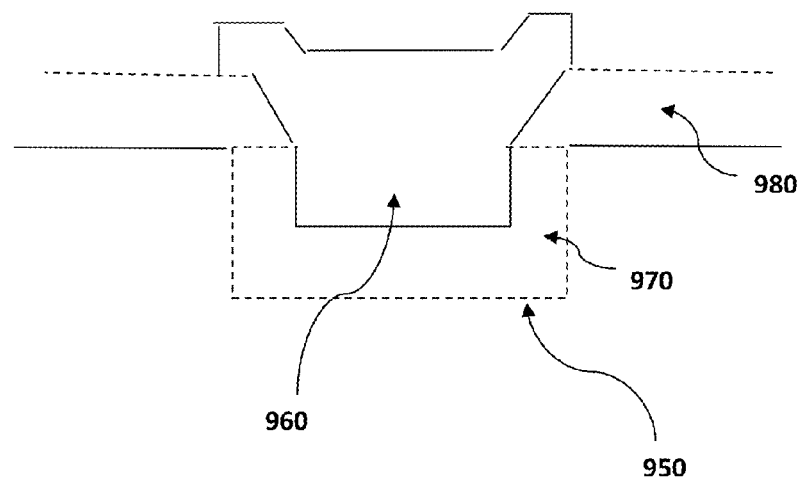

FIG. 13 shows a waveguide in a cross-sectional view which may be utilised for the invention.

In this case, FIG. 13(a), a thin LOCOS liner of the usual isolation trenches is made larger, followed by a suitable deposition or growth of Silicon oxi-nitride or Silicon nitride or polymer material such that a higher core index is formed in a lower index surrounding material. Finally a suitable surface layer can be deposited to encapsulate the higher index core also at the top surface.

Light may be coupled primarily into the CMOS overlayers through LOCOS and Si-Oxi-nitride or SiN based waveguide or optically transparent polymer structures. Alternatively the light may be coupled into Si-Oxi-nitride or SiN based waveguide trench based waveguide (OXI-TRENCH) structures, which can be primarily utilised in below 0.35 micron CMOS technologies. In this case, a thin LOCOS liner of the usual isolation trenches 920 in silicon substrate 900 is made larger, followed by a suitable deposition or growth of Silicon oxi-nitride or Silicon nitride such that a higher core index 910 is formed in a lower index surrounding material 930. Finally a suitable surface layer can be deposited to encapsulate the higher index core also at the top surface. The grading of the refractive index can be either made rectangular or circular, such that either single or multimode optical propagation occurs within the waveguide.

FIG. 13(b) shows in a cross-sectional view how an "inverted ridge" type of waveguide can be formed by depositing higher index core material 960 within the trench 950 and simply filling the trench up with this material. A thin oxide liner oxide layer on the sidewalls 970 and top surface 980 of the silicon can still be utilised in order to create the necessary refractive index grading.

In further embodiments, different over-layers may be deposited through masks using the same graded index concepts and definition of the optical index gradient laterally in the over-layer, such that a series of optical graded index waveguides are formed in the over-layers of conventional CMOS integrated circuitry, by employing appropriate post-processing procedures.

In further embodiments different over-layers may be deposited through masks using the same graded index concepts and definition of the optical index gradient both laterally and vertically in the over-layer, such that a series of optical graded index waveguides are formed directly on top of the insulating layer, normally the field oxide layer of CMOS IC's, such that a region of higher refractive index are formed directly above the field oxide layer, and such that a conventional rib waveguide or single or multimode mode high index fibre/waveguide are formed, and such that the emission from the Si CMOS LED effectively couple into the higher index part of the waveguide. The detail process and choice of materials can be chosen in order to optimize the technology. If necessary, optical layers may be pre-deposited before metal layers are deposited which are normally require a low thermal budget and are accommodated at the end of the CMOS processing procedure. The graded index composition can also be obtained with conventional glass doping and glass flow techniques. If necessary, certain dedicated optical modules can be separately fabricated using different processes, and pick and placed into position together with pick and placing of fibre optical modules after CMOS processing, and as a post processing procedure. These embodiments are usually suitable for implementation with above 0.35 micron CMOS technology.

Figure 14:
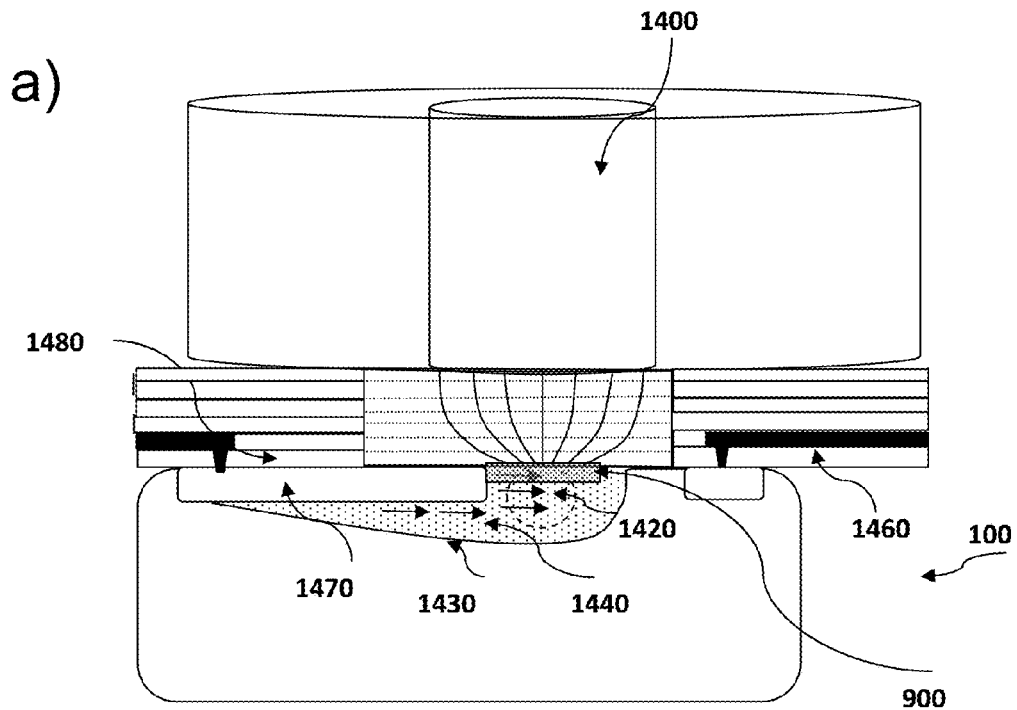
FIGS. 14a and 14b show a schematic diagram showing achievement of effective optical coupling of optical radiation from a Lateral Multiplication and Secondary Excitation Si LED, utilizing graded index optically transparent layers, into (a) an optical waveguide positioned immediately above the Si LED; and (b) an optical waveguide positioned in the CMOS chip over-layers
Figure 14:
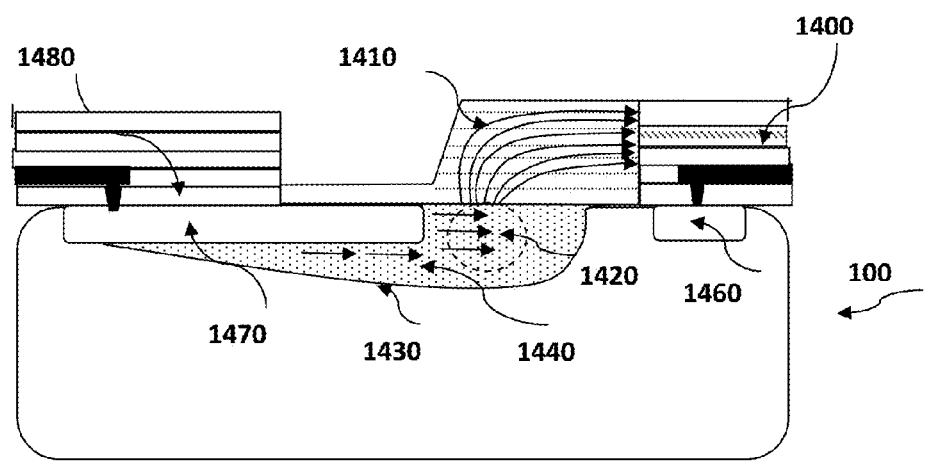

FIG. 14a shows an embodiment for coupling of optical radiation as emitted from the Si LED 100 into a vertically positioned waveguide 1400.

FIG. 14b shows an embodiment for coupling of optical radiation as emitted from the Si LED 100 into a laterally positioned waveguide 1400.

A window is wet-etched or dry-etched above the Si CMOS LED light emitting region 1420, having dimensions in the micron range. This is followed by appropriately masking the rest of the plan view of the CMOS chip with a mask and then depositing various layers 1410 of graded index in the cavity. If the choice of grading is chosen correct, in this case from low to high as one progress from the Si—SiO$_2$ interface towards the surface, refraction of light may be generated in two dimensions such that the emitted light is focused into the core of any single mode or multimode optical fibre, with a very good coupling coefficient.

A depletion layer 1430, a carrier excitation region 1440 are part of the Si LED 100, as well as second region 1170, electric contact region 1160 and oxide insulating layer 1180, similar to the devices as described with respect to the previous embodiments.

In further embodiments, different over-layers may be deposited through masks using the same graded index concepts and definition of the optical index gradient both laterally and vertically in the over-layer, such that a series of optical graded index waveguides are formed in the over-layers of conventional CMOS integrated circuitry, by employing appropriate post-processing procedures. In further embodiments different over-layers may be deposited through masks using the same graded index concepts and definition of the optical index gradient both laterally and vertically in the over-layer, such that a series of optical graded index waveguides are formed directly on top of the insulating layer, normally the field oxide layer of CMOS IC's, such that a region of higher refractive index are formed directly above the field oxide layer, and such that a conventional rib waveguide or single or multimode mode high index fibre/waveguide are formed, and such that the emission from the Si CMOS LED effectively couple into the higher index part of the waveguide. The detail process and choice of materials can be chosen in order to optimize the technology. If necessary, optical layers may be pre-deposited before metal layers are deposited which are normally require a low thermal budget and are accommodated at the end of the CMOS processing procedure. The graded index composition can also be obtained with conventional glass doping and glass flow techniques. If necessary, certain dedicated optical modules can be separately fabricated using different processes, and pick and placed into position together with pick and placing of fibre optical modules after CMOS processing, and as a post processing procedure. All these embodiments are usually suitable for implementation with above 0.35 micron CMOS technology.

Figure 15:
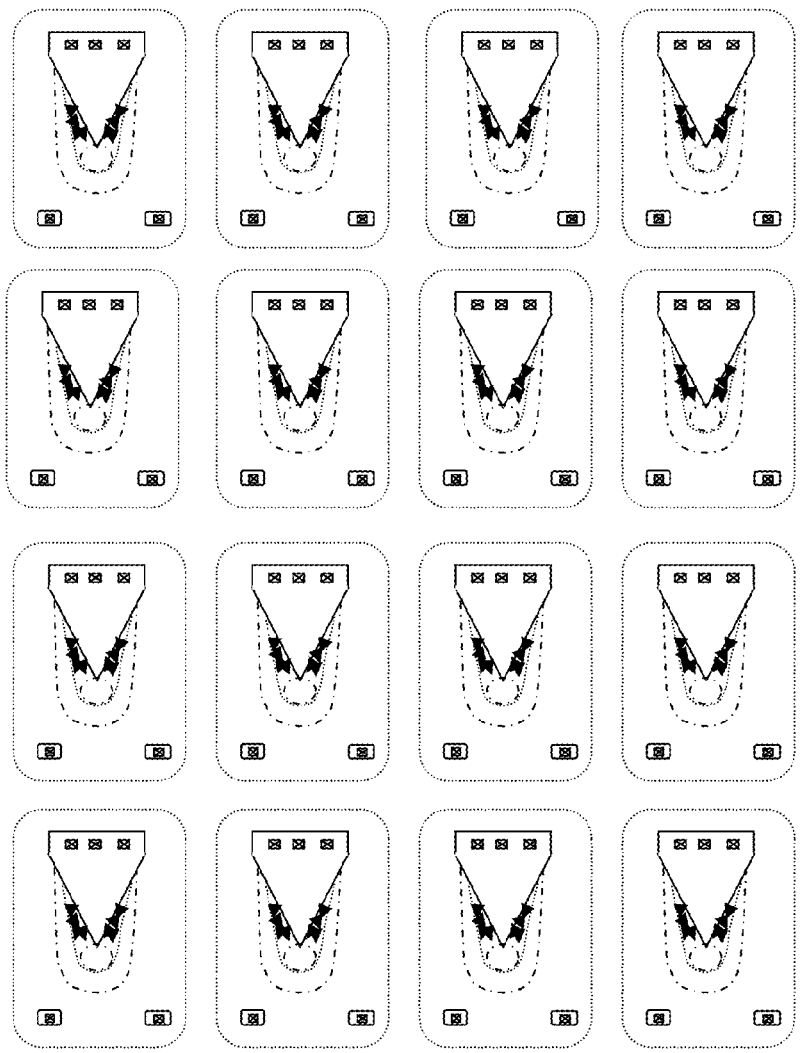
FIG. 15 is a plan view of a Low Voltage Modulatable Silicon Light Emitting Array/Matrix as composed by light emitting source elements as in FIG. 11 which can be utilised as a high pitch optical. Each light emitting source LED element can be individually addressed (power supplied) and modulated by means of two sets of metal over layer mesh networks. The addressing and coupling of signals can performed by state of the art CMOS address and encoding configuration.
Figure 16:
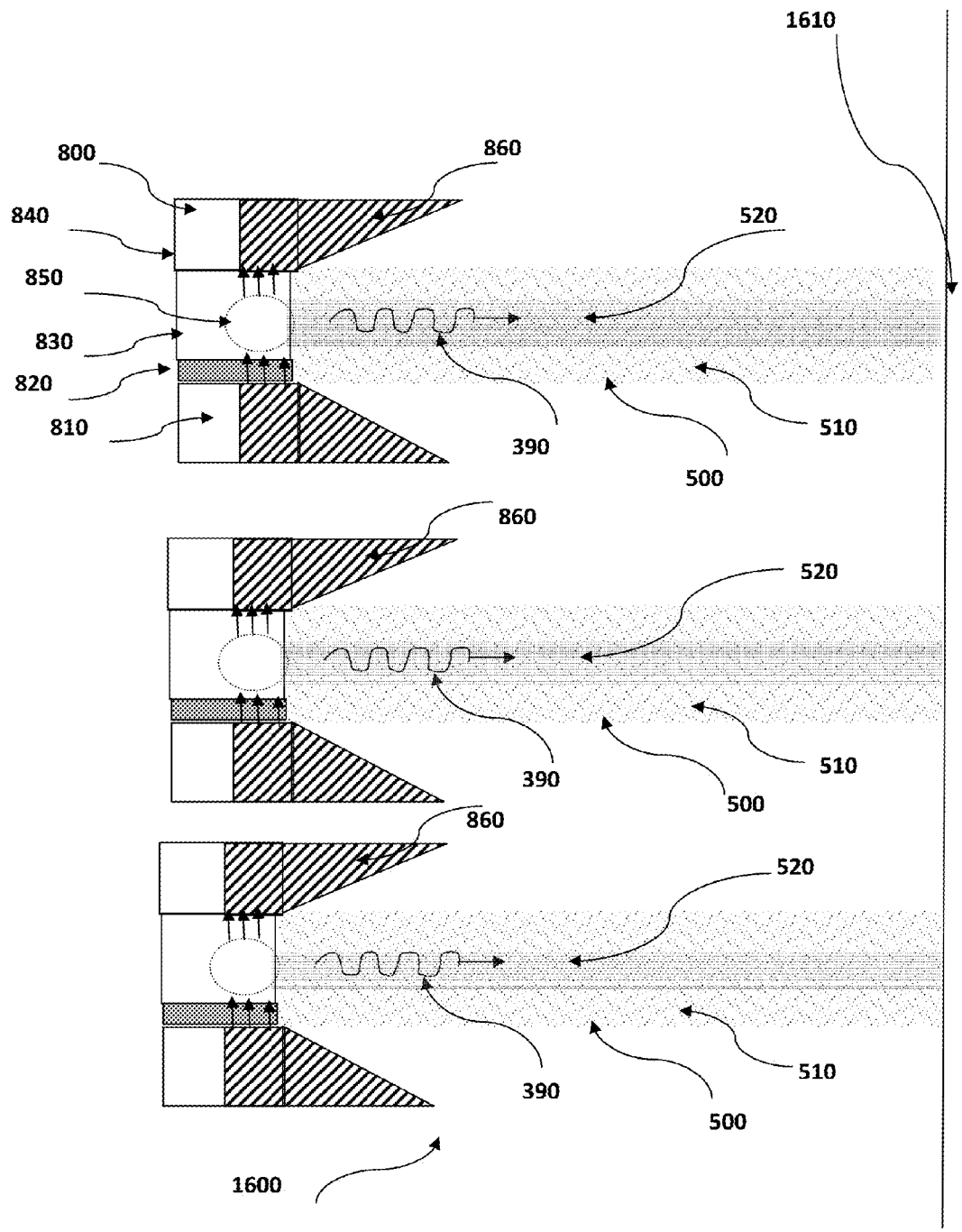
FIG. 16 shows an array of an optical interconnect structure that enables optical communication or data transfer from MOD-E Si LEDs on chip through waveguides to one of the side surfaces of the chip, where the optical radiation can couple directly into an array of optical fibres or other structures.

FIGS. 15 and 16 demonstrates further embodiments of the invention for optical interconnect applications for coupling optical radiation from the chip die to the external environment.

In FIG. 15, the structure as described in FIG. 11, demonstrating high efficiency and very small spot size, is utilised to create elements of an array of Si LEDs 1500. Because of the small dimensions and the simplicity of the structure, a very high pitch can be obtained per unit distance. Correspondingly, an array of optical fibres 1500 can be mounted on top of this array, enabling a multiple of optical paths vertically outwards from the CMOS chip surface. By means of suitable metal track placing and utilizing cell address and driving technology through encoders and multiplexers, each element in the array may also be individually modulated with respect to intensity.

In FIG. 16, the embodiment as described in FIG. 12 is utilized to create a row 1600 of waveguides that interfaces with the one side surface 1610 of the chip. Subsequently, a row of optical fibres can be mounted with the row of emerging optical fibres, appropriately aligned and ensure efficient from chip to environment communication. The embodiment as demonstrated in FIG. 12 particularly utilized a very efficient coupling of the lateral MOD E Si LED with the core of the high index core of the waveguide. In total, a very efficient coupling of optical radiation from the chip to the environment is obtained, at a very high degree of micro-dimensioning and compactness and ease of fabrication.

Although certain embodiments only have been described herein, it will be readily apparent to any person skilled in the art that other modifications and/or variations of the invention are possible. Such modifications and/or variations are therefore to be considered as falling within the spirit and scope of the invention as herein described and/or exemplified.

The invention claimed is:

1. A modified e-field silicon light emitting device capable of emitting light at the below threshold wavelength detection range for Silicon of 850 nm, the device comprising:
    a first body having four different regions namely a first region of high doping, a second and third region of lower doping, wherein the first region is arranged directly adjacent to the second region, the second region is arranged directly adjacent to the third region, and the third region is arranged directly adjacent to a fourth region, and first, second, third and fourth terminals for respectively directly electrically connecting the first, second, third and fourth regions of the first body, wherein at least the second and third terminals are in direct contact with their respective second and third regions, each of the four terminals comprising a metal layer through an oxide contact hole, wherein a first junction between the first and second regions is configured to be forward biased to inject carriers into the second region, wherein a second junction between the second and third regions is configured to be reversed biased into avalanche mode to excite carriers in the third region, wherein a third junction between the third and fourth regions is configured to be forward biased to inject carriers into the third region, and wherein the third region is configured to be optically transparent to directly emit optical radiation from the third region and away from the device.

2. The modified e-field Silicon Light emitting device as claimed in claim 1, wherein the second terminal electrically contacting the second region can biased such that the electric field profile in the lower doped second region is modified, so as extract or inject additional carriers into or from the second region, and so as to enhance the light emission from the device.

3. The modified e-field Silicon Light emitting device as claimed in claim 1, wherein the third and fourth terminals can be biased such that holes are injected from the fourth region into the third region 3 so that high densities of energetic electrons and low energy holes are injected from opposite sides that a high recombination of these carriers can occur.

4. The modified e-field Silicon Light emitting device as claimed in claim 1, wherein recombination processes to be dominant in the light generation process under almost zero E-field conditions in the third region.

5. The modified e-field Silicon Light emitting device as claimed in claim 1, wherein doping levels placed in the first or fourth region are such that the electrical field is modified in the second and third regions of the device and such that enhanced light emission occurs from the device.

6. The modified e-field Silicon Light emitting device as claimed in claim 1, wherein specific voltage biases applied to the respective regions of the device or contacts placed in the third region so as to cause a change in the wavelength of the optically emitted radiation from the device.

7. The modified e-field Silicon Light emitting device as claimed in claim 1, wherein Complementary Metal Oxide Semiconductor (CMOS) technology is used.

8. The modified e-field Silicon Light emitting device as claimed in claim 1, wherein utilizing Silicon on Insulator (SOI) technology is used.

9. An array of the modified e-field Silicon Light emitting device as claimed in claim 1, which formed as a matrix or as a linear arrangement.

10. The array as claimed in claim 9, wherein optical fibres are mounted on top of the array, enabling a multiple of optical paths vertically outwards from the CMOS chip surface and by means of suitable metal track placing and utilizing cell address and driving technology through encoders and multiplexers, each element in the array can be individually modulated with respect to intensity.

11. A wave-guiding configuration coupled to the device as in claim 1 such that the light is effectively coupled into the second body.

12. The wave-guiding configuration as claimed in claim 11, wherein light is coupled into the CMOS over-layers through LOCOS and Si-Oxi-nitride or SiN based waveguide or optically transparent polymer structures.

13. The wave-guiding configuration as claimed in claim 11, wherein light is coupled into Si-Oxi-nitride or SiN based waveguide trench based waveguide structures.

14. An electro-optical coupling arrangement coupled to the device as claimed in claim 1, such that the light is effectively coupled from each individual light emitting device through a series of layers each having different refractive indices or a system of graded refractive index layers, such that enhanced light coupling is achieved from the light emitting device to the second body.

15. A method employing a modified e-field silicon light emitting device capable of emitting light at the below threshold wavelength detection range for Silicon of 850 nm, wherein the device comprises:

a first body having four different regions namely a first region of high doping, a second and third region of lower doping, wherein the first region is arranged directly adjacent to the second region, the second region is arranged directly adjacent to the third region, and the third region is arranged directly adjacent to a fourth region, first, second, third and fourth terminals for respectively directly electrically connecting the first, second, third and fourth regions of the first body, wherein at least the second and third terminals are in direct contact with their respective second and third regions, each of the four terminals comprising a metal layer through an oxide contact hole, wherein a first junction between the first and second regions is configured to be forward biased to inject carriers into the second region, wherein a second junction between the second and third regions is configured to be reversed biased into avalanche mode to excite carriers in the third region, wherein a third junction between the third and fourth regions is configured to be forward biased to inject carriers into the third region, and wherein the third region is configured to be optically transparent to directly emit optical radiation from the third region and away from the device, and wherein the method comprises:

changing a bias voltage between the first and third region to change a wavelength of an optical emission of the device; or changing a bias voltage on the second electrical terminal to increase an emission intensity of the device.

16. The Silicon Light emitting device as claimed in claim 2, wherein the third and fourth terminals can be biased such that holes are injected from the fourth region into the third region so that high densities of energetic electrons and low energy holes are injected from opposite sides that a high recombination of these carriers can occur.

* * * * *